US005432482A

United States Patent [19]
Bailey

[11] Patent Number: 5,432,482
[45] Date of Patent: Jul. 11, 1995

[54] VARIABLE-FREQUENCY MICROWAVE OSCILLATOR WITH MULTI-RESONATOR MATCHING CIRCUIT

[76] Inventor: Michael J. Bailey, 1633 Klipspringer Dr., San Jose, Calif. 95124

[21] Appl. No.: 283,021

[22] Filed: Jul. 28, 1994

[51] Int. Cl.$^6$ .................. H03B 5/18; H03B 7/14; H03B 9/14
[52] U.S. Cl. ..................... 331/56; 331/99; 331/107 P; 331/107 SL; 331/172
[58] Field of Search ............. 331/56, 96, 99, 107 DP, 331/107 P, 107 SL, 117 D, 172

[56] References Cited

U.S. PATENT DOCUMENTS

| 3,721,919 | 3/1973 | Grace | 331/107 SL |
| 3,952,262 | 4/1976 | Jamison | 331/107 SL |
| 4,121,174 | 10/1978 | Aston | 331/48 |

OTHER PUBLICATIONS

S. Nogi et al., "TM$_{0n0}$—and TM$_{m10}$—Mode Oversized Cylindrical Cavity Power Combiners," *IEEE Trans. on Microwave Theory and Techniques*, vol. MTT-35, No. 9, Sep. 1987, pp. 835–842.
S. E. Hamilton, "32 Diode Waveguide Power Combiner," 1980 *MTT-S Digest*.
S. E. Hamilton et al., "X-Band Pulsed solid State Amplifier," 1980 *MTT-S Digest*.
C. A. Drubin et al., "A 1KW peak, 300 W avg IMPATT Diode Injection Locked Oscillator," 1982 *MTT-S Digest*, pp. 126–128.
M. Adlerstein et al., "A Multi-IMPATT Injection-Locked Oscillator at 35 GHz," *IEEE Trans. on Microwave Theory and Techniques*, vol. 37, No.3, Mar. 1989, pp. 571–579.
D. Kinman et al., "Symmetrical Combiner Analysis Using S-Parameters," *IEEE Trans. on Microwave Theory and Techniques*, vol. MTT-30, No. 3, Mar. 1982, pp. 268–277.
K. Kurokawa, "The Single-Cavity Multiple Device Oscillator," *IEEE Trans. on Microwave Theory and Techniques*, vol. MTT-19, No. 10, Oct. 1971, pp. 793–801.
N. L. Wang et al., "Monolithic IMPATT Oscillator Characterization," *IEEE Trans. on Microwave Theory and Techniques*, vol. 37, No. 2, Feb. 1989, pp. 393–399.

Primary Examiner—Siegfried H. Grimm

[57] ABSTRACT

An injection-locked variable-frequency high-power microwave frequency generator includes an injection source, a circulator, and an oscillator. The circulator includes an injection port to the injection source, an oscillator port to the oscillator, and a transmission port. The circulator directs the injection signal from the injection source into the oscillator and directs the oscillator output out the transmission port. The oscillator includes an IMPATT diode and a microstrip matching circuit. The matching circuit provides the sufficient conditions for broadband (9.1–9.5 GHz) oscillation of the diode. To this end, the matching circuit provides three resonators having three different but closely coupled resonant frequencies. The matching circuit also serves as a transformer, providing impedance matching to the circulator. A high-power output can be chirped or otherwise controlled by electronic control of the injection frequency.

7 Claims, 5 Drawing Sheets

VARIABLE-FREQUENCY MICROWAVE OSCILLATOR WITH MULTI-RESONATOR MATCHING CIRCUIT

BACKGROUND OF THE INVENTION

The present invention relates to high-power microwave oscillators and, more particularly, to such oscillators using negative resistance diodes. A major objective is to provide for linear frequency modulation ("chirping") for weather avoidance radar systems.

As a precaution against weather-related problems, modern aircraft avionics include weather radar systems to detect atmospheric turbulence. In classical pulse Doppler radar systems, a brief single-frequency high-power pulse is directed into an atmospheric region of interest. Atmospheric moisture partially reflects the transmitted pulse's energy back to the aircraft; a series of reflections from features at various ranges are then received and processed by the system. A feature's range and relative speed can be determined by the reflection delay time and frequency shift caused by the Doppler effect. The aircraft speed can then be factored out to determine the true ground speed of each feature. A velocity versus position map can be constructed to illustrate the weather system. This map can be used by the aircraft to avoid severe turbulence.

To provide earlier anticipation of turbulence, longer range weather radar is desired. Since power falls off as the fourth power of the round trip signal distance, there is a continuing need for increased pulse power. Furthermore, for a given range, higher power means that reflections are more easily distinguished from background noise. This makes it possible to determine range and Doppler shift with greater precision.

Most high-power pulse generators use one or more oscillators combined to allow for higher peak power during transmission. IMPATT (impact-ionization and transit time) diodes can be used as high-power oscillators. When configured with hollow-rectangular or coaxial waveguides as external resonant cavities, high power can be achieved within a narrow frequency band. Multiple IMPATT diodes can be combined (with separate or a shared external cavity) with little loss of efficiency to achieve greater power. Where greater spectral purity is required, Gunn-effect diodes can be used instead of IMPATT diodes, although Gunn-effect diodes produce far less power per diode.

For a given maximum peak pulse power, the pulse's total energy increases with increasing pulse duration. To an extent, greater range and precision can be achieved by taking advantage of the greater energy associated with longer pulses. Offsetting these gains in range and Doppler precision are range errors due to transmitter and receiver bandwidth limitations. Real transmitter and receiver systems have finite bandwidths, which make it impossible to generate pulses with zero rise and fall times. It has been established that, for a bandwidth-limited system, use of a rectangular pulse results in a range error that is approximately proportional to the square root of the pulse duration. Thus, for a given peak pulse power, there is a tradeoff between range and precision.

This tradeoff is addressed by a technique known as "pulse compression." Pulse compression uses a long transmitted pulse to achieve high pulse energy; the pulse reflections are compressed to minimize range errors. Thus, greater range and greater precision can be achieved together.

In pulse compression, the frequency of the transmitted pulse is linearly modulated from a low frequency to a high frequency; this linear frequency modulation is commonly referred to a "sweeping" or "chirping." The difference between the highest and the lowest frequencies is termed the "chirp bandwidth." The chirp serves as a signature that also characterizes the pulse reflections. The received reflection sweeps are then passed through a frequency-dependent delay device, such as a surface acoustic wave (SAW) device, for which the delays imposed vary inversely with frequency. Thus the lower leading frequencies of a reflection sweep are delayed more than the higher frequencies so that all frequencies exit the delay device at the same time. As a result the reflected chirp pulse is compressed into a narrow pulse.

The peak energy of a pulse is augmented by compression so that the reflection is more readily distinguished from background noise. This enhanced signal-to-noise ratio improves range and Doppler precision. Furthermore, the contribution to range error proportional to the square root of pulse duration is obviously reduced due to pulse compression.

Pulse compression requires an oscillator frequency range that meets or exceeds the intended sweep frequency range, and frequency control so that a narrow output frequency can be precisely swept across the range. For purposes of weather avoidance radar, a typical pulse compression scheme could be realized with a sweep covering the 9.1-9.5 GHz range allocated to airborne navigational aids such as weather avoidance radar. This range has a fractional bandwidth which is 4.3% of its center frequency.

Sufficient frequency bandwidth and frequency control can be obtained using transistor-based oscillators. Transistors that are normally used in amplifiers can be used in oscillator circuits; in these circuits the transistor's output is fed back to its input so as to provide positive feedback. The frequency of the oscillator output can be set by a coupled lower power oscillator or resonant circuit. A quartz crystal is commonly used for a fixed-frequency output. A device with a controllable impedance can be used for variable frequency control; a varactor (variable reactance) diode is suitable for this purpose.

The output transistors can be silicon or gallium arsenide bipolar devices, or gallium arsenide metal-semiconductor field effect transistors (MESFETs), depending on the frequency of operation. The highest power transistors are relatively inefficient at microwave and millimeter wave frequencies. Other transistors lose less efficiency when operated at these high frequencies, but have lower maximum powers to begin with. None of the individual transistor oscillators provides an output comparable to that available from IMPATT diodes in the microwave frequency range. (Herein, "microwave" includes centimeter and millimeter wavelengths.)

A large total power can be achieved by arranging many transistor oscillators in a two-dimensional array. Such an array of tunable transistors can provide high-power chirps for weather radar. However, the cost and complexity of such arrays are quite high. High-power bipolar transistors can be expensive. Configuring a system so that all the transistors operate coherently is demanding and expensive.

IMPATT diode oscillators have a substantially greater power output than transistor-based oscillators. It would be desirable to sweep these over the entire 9.1–9.5 GHz range. However, the bandwidth of typical IMPATT diode oscillators is an order of magnitude less than the 4.5% bandwidth of this range. Furthermore, IMPATT diode oscillators typically couple an IMPATT diode with an external cavity such as a hollow rectangular waveguide or coaxial waveguide. These waveguides are characterized by a high Q-factor ("quality"), which generally implies high power efficiency, but narrow bandwidth. The frequency of oscillation is dependent on external cavity dimensions. While it is possible to tune such oscillators by disassembling and reassembling the waveguides and related components, it is difficult to vary frequency in a predictable manner "on line."

There have been several attempts to design a narrow-band matching circuit in a microstrip format for negative resistance devices. In some cases, the active device and its matching circuit have been fabricated monolithically on a gallium-arsenide substrate. Such oscillators operated in a pulsed mode provide high peak power in a compact format and at relatively low cost. The tradeoffs are spectral purity and maximum power relative to oscillators using waveguides as external cavities.

Inherently narrow-band external cavity oscillators, such as those using hollow-metal rectangular and coaxial waveguide cavities, can be made broad band by the inclusion of resistive elements. However, these resistive elements have a severe effect on output power. Accordingly, this approach to high-power variable-frequency power transmission has not found many applications.

Accordingly, the objectives of achieving variable frequency and high power in a microwave transmitter are at odds. Higher power can be achieved at a single frequency, and variable frequency can be achieved at lower powers. Very large arrays of variable-frequency low-power oscillators offer a complex and expensive approach to meeting both of the conflicting objectives. What is needed is an economical variable-frequency high-power oscillator. This would allow for high-power broad-band controllable oscillators needed for pulse-compression radar, and thus longer range and more economical avionics weather avoidance systems.

SUMMARY OF THE INVENTION

The present invention provides a variable-frequency high-power microwave frequency generator comprising a negative-resistance diode oscillator, an injection source, and a coupling circuit. The oscillator includes a negative-resistance diode and multi-resonator matching circuit.

The matching circuit provides a diode port and a coupling port. The diode port is coupled to the diode device. The matching circuit presents to the diode an impedance that sufficiently conjugately matches the diode's impedance that the conditions for oscillation are met over a predetermined frequency "oscillator" range (e.g., 9.1–9.5 GHz). The matching circuit also transforms the diode's impedance to a coupling device impedance (50 ohms is standard).

In accordance with the present invention, the matching circuit includes a series of resonators. Each resonator has a respective peak frequency and an associated half-power range. Each half-power range has an associated resonator bandwidth. At least some of the resonators have different peak frequencies, but are closely coupled so that the half-power ranges of adjacent peaks overlap. Every frequency within the oscillator range is within at least one of the half-power ranges, while some frequencies are within two (or more) half-power ranges. The diode device and the matching circuit together constitute an oscillator.

Injection locking is a technique whereby a narrow-band output is achieved using a broad-band oscillator. A relatively low-power narrow-band signal is directed into the oscillator, which then oscillates preferentially at the injected frequency. The injection source can be a voltage-controlled oscillator, which can be transistor based. Electronic control of the transistor output frequency affords control of the oscillator output. Injection locking also has the advantage of preserving the spectral purity of the injection signal; in other words, the oscillator does not degrade the spectral properties of the injection signal even though the output power is much greater.

The coupling circuit includes an injection port, an output port, and an oscillator port. The injection port is connected to the injection source, while the oscillator port is connected to the coupling port of the matching circuit. The output port is the frequency generator output. The coupling circuit directs the injection signal from the injection source into the matching circuit. The coupling circuit also directs the oscillator output from the interface port to the transmitter output for transmission.

The present invention provides for the use of a single high-power oscillator. In this case, there is one power diode, one matching circuit, and one circulator serving as the coupling circuit. The invention also provides for the use of two power diodes and, correspondingly, two oscillator ports for the coupling circuit. The coupling circuit in this case can be a rectangular branch-line coupler. More generally, the invention provides for n diodes, n matching circuits, and n oscillator ports. For n>2, the coupling circuit can use signal splitters to distribute the locking-signal waveform and combiners to combine the output of the multiple diodes. Of course, the oscillators can be arranged in series to provide greater total gain.

One advantage of the present invention is that it achieves a relatively broad bandwidth using multiple high-Q resonators in the matching circuit rather than using a relatively low-Q resistive matching circuit. The high-Q results in low loss and thus higher power, greater frequency range, and less power dissipation and heat generation.

Another advantage of the invention is that it is compatible with more compact and more economical microwave circuit technologies. For example, the impedance characteristics of an IMPATT diode can be matched over a significant frequency range using a microstrip matching circuit. Other planar waveguide technologies, such as suspended substrate stripline or coplanar waveguide, can be employed. In each of these three planar technologies, a waveguiding structure includes a patterned conductor on a solid dielectric layer.

By sweeping the injector frequency from 9.1–9.5 GHz, the present invention can provide for generation of a high-power pulse, the frequency of which is swept through this same range. By implementing the chirping frequency generator using IMPATT diodes and microstrip, a cost effective, light weight, and compact pulse-compression radar system suitable for long-range weather avoidance can be realized. IMPATT diodes are significantly more cost effective than high-power transistors. These and other features and advantages of the invention are apparent from the description below with reference to the following drawings.

DESCRIPTION OF THE PREFERRED EMBODIMENTS

Figure 1:
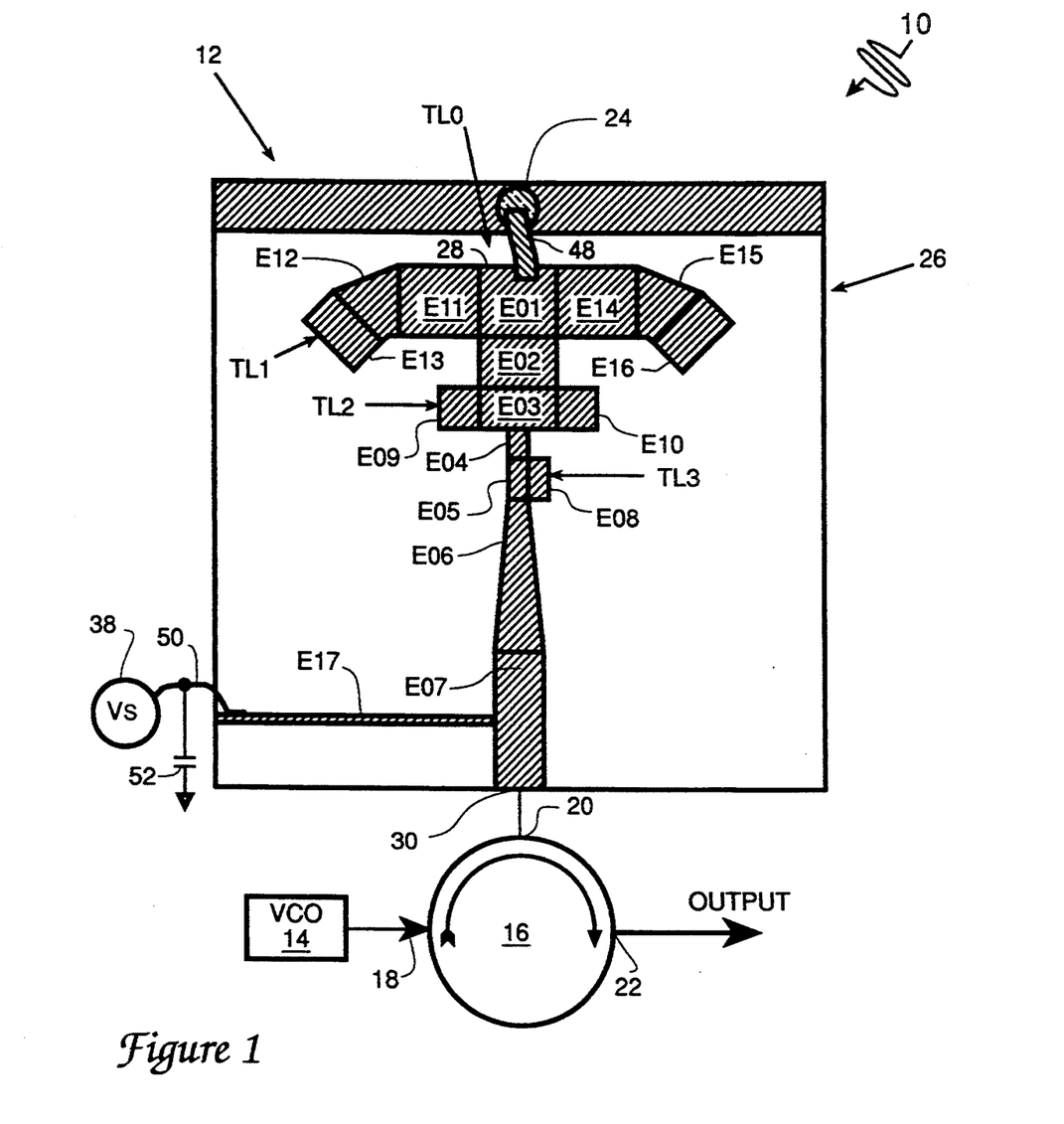
FIG. 1 is a plan view of a single-oscillator frequency generator in accordance with the present invention.
Figure 2:
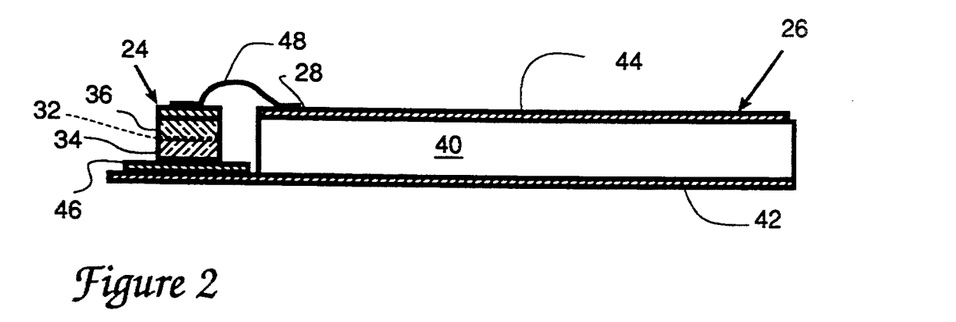
FIG. 2 is a schematic side sectional view of a portion of an oscillator of the frequency generator of FIG. 1.

In accordance with the present invention, a single-oscillator frequency generator 10 includes a high power oscillator 12, a voltage-controlled oscillator (VCO) 14, and a circulator 16, as shown in FIGS. 1 and 2. VCO 14 outputs a single frequency waveform in the 9.1 to 9.5 GHz range as determined by its input voltage; thus, VCO 14 serves as an injection source.

Circulator 16 has an injection port 18 coupled to injection source 14, an oscillator port 20 coupled to oscillator 12, and a transmission port 22 that serves as the output of transmitter 10. Circulator 16 uses a magnetic Faraday effect to provide directional coupling. Circulator 16 directs the injection waveform to oscillator 12, which is thereby injection locked. Oscillator 12 thus oscillates at the frequency of the injection waveform. The oscillator output is directed by circulator 16 out transmission port 22.

Oscillator 12 includes an IMPATT diode 24 and a matching circuit 26. Matching circuit 26 has a diode port 28 coupled to diode 24 and a coupling port 30 coupled to oscillator port 20 of circulator 16. Diode 24 has a p/n junction 32, an anode 34 connected to ground and a cathode 36 connected to diode port 28 of matching circuit 26, as seen in FIG. 2. Matching circuit 26 includes a DC source 38, shown in FIG. 1. DC source 38 applies a reverse bias of $V_S = 60$ volts that exceeds the breakdown voltage ($V_{BD} \approx 45$ volts) of IMPATT diode 24. With this bias, diode 24 exhibits negative resistance when driven in the 9.1 to 9.5 GHz range.

Figure 3:
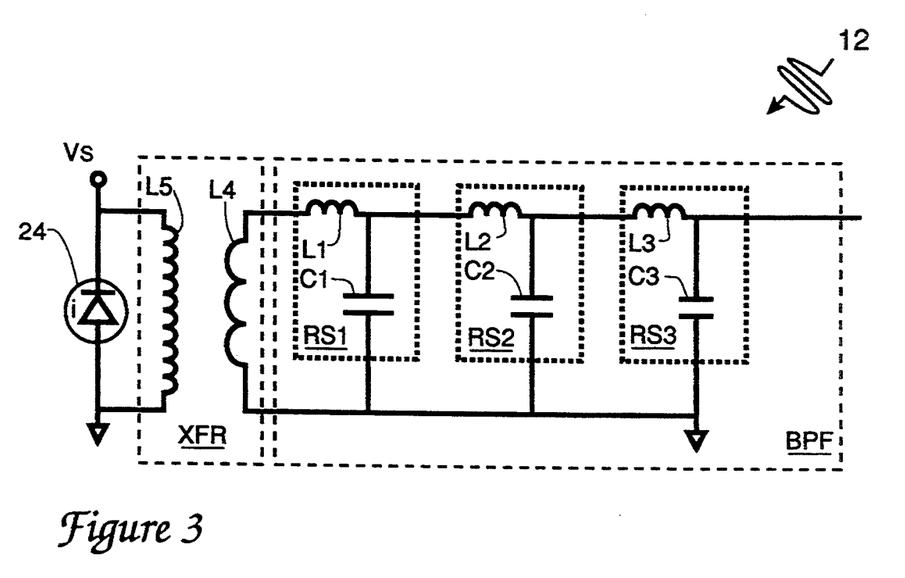
FIG. 3 is a schematic of a functionally equivalent circuit for the oscillator of FIG. 2.

Matching circuit 26 serves as a transformer XFR and a band pass filter BPF, which are initially described as bulk components with reference to FIG. 3. As described below, transformer XFR and filter BPF are actually implemented in a distributed manner.

Filter BPF includes three resonators RS1, RS2 and RS3, as shown in FIG. 3. Resonator RS1 comprises an inductor L1 and a capacitor C1; resonator RS2 comprises an inductor L2 and a capacitor C2, and resonator RS3 comprises an inductor L3 and a capacitor C3.

Figure 4:
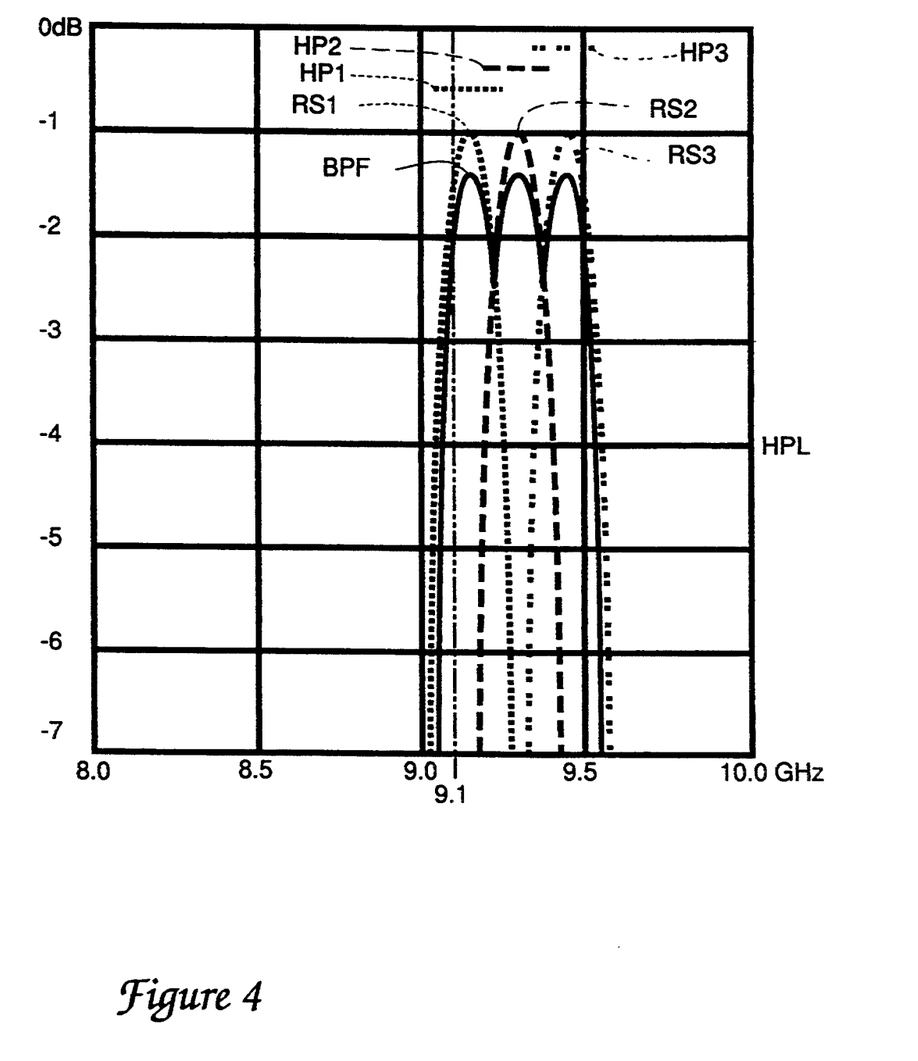
FIG. 4 is a graph illustrating the filter characteristics of a matching circuit of the transmitter of FIG. 1.

Each resonator has, as a function of frequency, an insertion loss ($=20 \times \log$ (power out/incident power)), as shown in FIG. 4. Each resonator has a peak frequency and a half-power range. Each half-power range has a corresponding bandwidth equal to the differences between its extreme frequencies. Each peak frequency corresponds to an insertion loss of 1 decibel (dB) due to finite losses. (An ideal, i.e., infinite-Q, resonator would have zero insertion loss at its resonant frequency.) Accordingly, the half-power range for each resonator is taken 3 dB down from the peak, or at the $-4$ dB level of FIG. 4.

Resonator RS1 has a center frequency of 9.15 GHz and a half-power range HP1 of 9.04–9.25 GHz; its half-power bandwidth is 0.21 GHz. Resonator RS2 has a center frequency of 9.3 GHz and a half-power range HP2 of 9.19–9.40 GHz; its half-power bandwidth is 0.21 GHz. Resonator RS3 has a center frequency of 9.45 GHz and a half-power range HP3 of 9.34–9.55 GHz; its half-power bandwidth is 0.21 GHz. The three half-power ranges collectively cover the range of generator 10 in that every frequency within its nominal 9.1–9.5 GHz range is within at least one of the three half-power resonator ranges. Collectively, resonators RS1, RS2, and RS3 provide a relatively wide oscillator bandwidth, as indicated in FIG. 4. However, each resonator has a relatively high Q of about 230, so the wide bandwidth is achieved with relatively low loss.

Transformer XFR provides for impedance matching between diode 24 and circulator 16, which has a standard 50 ohm impedance. Accordingly, transformer XFR has an effective a 3.1:1 turn ratio between its inductors L4 and L5 to match the real part of the conjugate of the diode's impedance to 50 ohms. This impedance matching minimizes microwave reflections, thus maximizing output power of frequency generator 10.

The structure of matching circuit 26 is implemented as shown in FIG. 2. Matching circuit 26 comprises a dielectric substrate 40, a ground plane 42 bonded to one side of substrate 40, and a metal pattern 44 bonded to the opposite side of substrate 40. Ground plane 42 extends beyond substrate 40 to provide for convenient mounting and grounding of external components such as diode 24. Metal pattern 44 is 0.2 mil (thousandths of an inch) gold-plated copper; dielectric substrate 40 is 20-mil alumina; and ground plane 42 is 100-mil gold-plated copper. Alternative conductors include solid gold and solid copper. Alternative dielectrics include quartz, sapphire, and various polymer-based materials.

Physically and electrically connected to anode 34 is an integral gold disk-shaped heat sink 46. This heat sink is bonded to ground plane 42. This grounds anode 34 so that diode 24 is reversed biased when a positive dc voltage is applied to its cathode 36. Cathode 36 is gold plated. A 10 by 15 mil gold ribbon 48 is bonded to cathode 36 at one end and to metal pattern 44 at the other to complete electrical interconnection of diode 24 with matching circuit 26. Gold ribbon 48 serves, to a first approximation, as inductance L1 of resonator RS1 in the lumped-element representation of FIG. 3.

Metal pattern 44 comprises a main transmission line TL0 and three open-ended transmission lines TL1, TL2, and TL3, as shown in FIG. 1. Main transmission line TL0 has 7 elements, E01–E07. Microstrip cross junction E01 is part of diode port 28 in that gold ribbon 48 from diode cathode 36 is bonded thereto. Microstrip cross junction E01 also serves as the intersection between main transmission line TL0 and open-ended transmission line TL1.

Microstrip transmission line E02 is connected to the downstream end of E01 and, to a first approximation, serves as inductor L2 for resonator RS2. Microstrip cross junction E03 is connected to the downstream end of E02 and serves as the intersection of main transmission line TL0 with open ended transmission line TL2. Microstrip transmission line E04 is connected to the downstream end of E03 and serves, to a first approximation, as inductor L3 for resonator RS3. Microstrip "T" junction E05 is connected to the downstream side of E04 and serves as the intersection of main transmission line TL0 and open-ended transmission line TL3.

Tapered transmission line E06 is designed to effect a gradual width increase from the width of connected element E05 to a standard microstrip 50 ohm width. This width characterizes microwave transmission line E07 that serves as the power portion of coupling port 30.

Microstrip transmission line E08 is connected to one side of T junction E05 to constitute open-ended transmission line TL3. Due to its interaction with dielectric 40 and ground plane 42, transmission line E08 functions as capacitor C3 to a first approximation.

Microstrip transmission lines E09 and E10 are connected to opposite sides of microstrip cross junction E03. Together, E09, E03, and E10 constitute open-ended transmission line TL2, which functions as capacitor C2 to a first approximation.

Opened-ended transmission line TL1 has two identical branches. One branch includes microstrip transmission line E11, microstrip transmission line bend E12 and microstrip transmission line E13 connected as shown in FIG. 1. The second branch likewise includes microstrip transmission line E14, microstrip transmission line bend E15, and microstrip transmission line E16. Elements E11–16 plus E01 constitute open-ended transmission line TL1 and function as capacitor C1 to a first approximation. The purpose of bend elements E12 and E15 is to keep open ends E13 and E16 away from the diode edge of microstrip circuit 26 to avoid difficult-to-characterize edge effects.

The dimensions of elements E01–E16 that determine their respective contributions to the impedance characteristics of matching circuit 26 are given in mils in the table below. Bend elements E12 and E15 provide a 45° bend and a 20% chamfer. Lengths for elements E01–E07 are taken along main transmission line TL0. Lengths for other elements are taken along their respective open transmission lines.

| T-Line | Element | Length | Width |
| --- | --- | --- | --- |
| TL0 | E01 | 34 | 38 |
| " | E02 | 25 | 38 |
| " | E03 | 20 | 38 |
| " | E04 | 14 | 9 |
| " | E05 | 20 | 9 |
| " | E06 | 75 | 9–25 |
| " | E07 | 100 | 25 |
| TL3 | E08 | 9 | 20 |
| TL2 | E09 | 20 | 20 |
| " | E10 | 20 | 20 |
| TL1 | E11 | 40 | 34 |
| " | E12 | — | 34 |
| " | E13 | 40 | 34 |
| " | E14 | 40 | 34 |
| " | E15 | — | 34 |
| " | E16 | 40 | 34 |
| — | E17 | 2 | 130 |

In addition to the transmission line elements, there is a conductor element E17 that provides a path for the dc bias current from dc source 38 to the cathode 36 of diode 24. Conductor element E17 is connected to dc source 38 by a gold ribbon 50. Conductor element E17 is also strapped to a 30 picofarad (pf) capacitor 52, the other end of which is connected to ground plane 42.

Within the 9.1–9.5 GHz range, capacitor 52 presents an impedance of about 1 ohm, which is effectively a short to ground. Conductor element E17 is $\frac{1}{4}$ wavelength long at the center frequency of 9.3 GHz. This configuration functions as an open circuit, preventing shorting of the oscillator output along conductor element E17 to ground.

Figure 5:
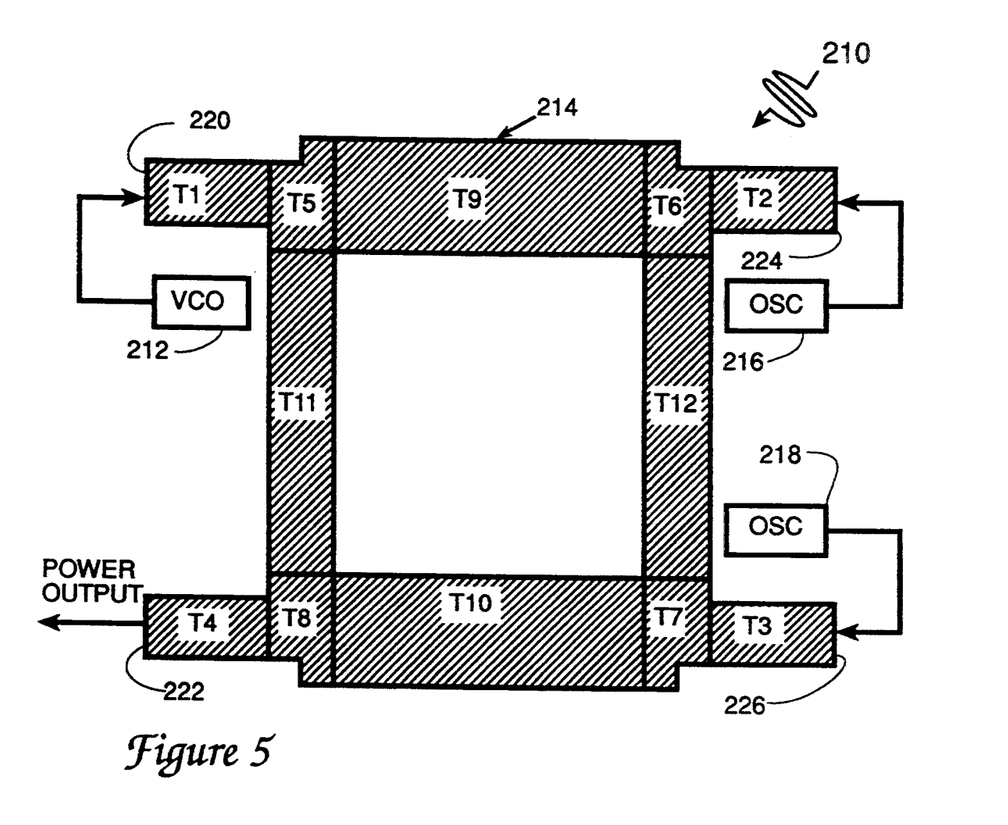
FIG. 5 is a schematic illustration of a dual-oscillator frequency generator in accordance with the present invention.

A dual-diode frequency generator 210 comprises an injection source 212, a branch coupler 214, and two power oscillators 216 and 218, as shown in FIG. 5. Injection source 212 is essentially identical to injection source 14 of transmitter 10. Both power oscillators 216 and 218 are essentially identical to power oscillator 12 of transmitter 10. Other than the number of power oscillators, the main difference between frequency generators 10 and 210 lies in the coupling circuit.

Branch coupler 214 has an injection port 220, a transmission port 222, and two oscillator ports 224 and 226 to couple to respective coupling ports of oscillators 216 and 218. Branch coupler 214 divides and couples the injection signal equally into oscillators 216 and 218. Branch coupler 214 combines the outputs of oscillators 216 and 218 to direct them out transmission port 222. Branch coupler 214 relies on constructive and destructive interference to provide the desired directional coupling.

Branch coupler 214 is implemented as a microstrip structure with a ground plane, a dielectric substrate, and a metal pattern. The metal pattern includes twelve elements T1–T12. Tab elements T1–T4 serve respectively as injection port 220, oscillator port 224, oscillator port 226 and transmission port 222. Corner elements T5–T8 are coupled to respective ones of tabs T1–T4.

Transmission line T9 provides a physical and electrical connection between corners T5 and T6, thus extending between injection port 220 and oscillator port 224. Transmission line T10 provides a physical and electrical connection between corners T7 and T8, and extends between oscillator port 226 and transmission port 222.

Transmission line T11 provides a physical and electrical connection between corners T5 and T8, thus extending between injection port 220 and transmission port 222. Transmission line T12 provides a physical and electrical connection between corners T6 and T7 and thus extends between oscillator port 224 and oscillator port 226.

Tab elements T1–T4 have nominally identical dimensions. Transmission lines T9 and T10 are nominally identical. Transmission lines T11 and T12 are nominally identical. Corners T5 and T7 are nominally identical. Corners T6 and T8 are nominally identical and nominally mirror images of corners T5 and T7. The tab dimensions are 40 by 20 mils. Transmission lines T9 and T10 are about 105 by 36 mils, while transmission lines T11 and T12 are about 105 by 20 mils. Corner element dimensions are dictated by the already-characterized elements.

Figure 6:
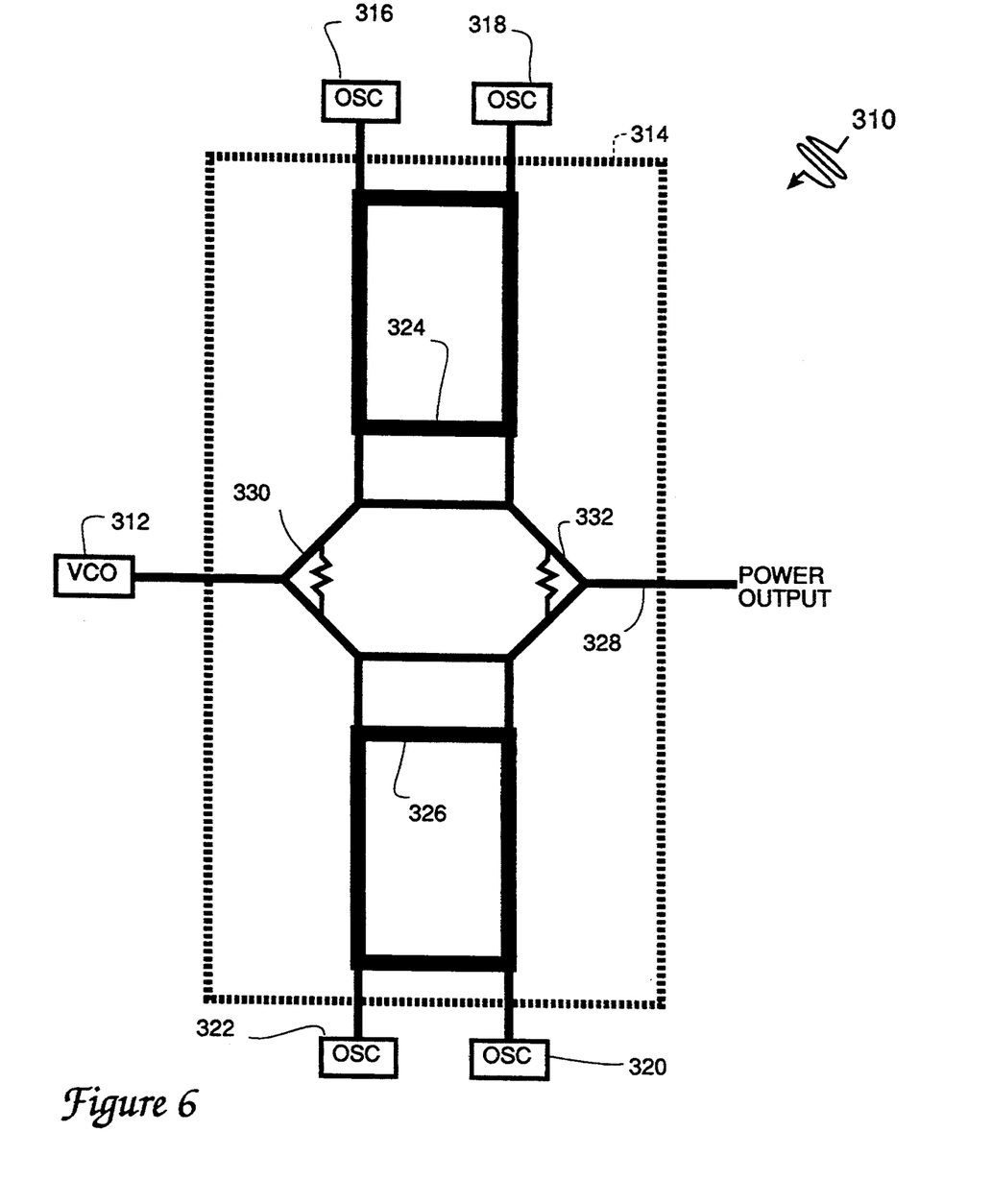
FIG. 6 is a schematic illustration of a four-oscillator frequency generator in accordance with the present invention.

A four-oscillator frequency generator 310 comprises an injection source 312, a coupling circuit 314, and four oscillators 316, 318, 320, and 322, as shown in FIG. 6. The oscillators and injection source are as in transmitters 10 and 210. Coupling circuit 314 includes two branch couplers 324 and 326. In addition, coupling circuit 314 includes a power splitter 330 for dividing the injection signal between branch couplers 324 and 326, and a power combiner 332 for combining the outputs of branch couplers 324 and 326 for transmission port 328. Through the use of such splitters and combiners, the present invention is scalable to any number of power oscillators.

While the above-described embodiments are designed to operate in the 9.1–9.5 GHz range, other microwave ranges (including centimeter and millimeter wavelengths) can be provided for by varying components and dimensions. While the matching circuits disclosed included three resonators, matching circuits with two resonators and four or more resonators can be used to achieve different filter characteristics. In addition, different resonator Qs can be provided for. While the filters are of the Tchebyshev type, Butterworth and other filter configurations can be incorporated. In addition to IMPATT diodes of various characteristics, Gunn-effect diodes, TRAPATT (trapped plasma and transit time) diodes, and other two-terminal negative resistance devices can be used in the oscillators.

While microstrip is the preferred matching circuit medium for the application addressed, other planar technologies including stripline, suspended substrate stripline, coplanar waveguide, and finline waveguide are provided for. In some cases, multiple rectangular hollow waveguide or coaxial external cavity resonators can be used.

Different injection sources are provided for. The voltage controlled oscillator can be a varactor-tuned oscillator. Alternatively, a YIG (Yttrium-Indium-Garnet) oscillator can be used as the injection source. Note that while the application of interest requires a linear frequency sweep, the present invention also provides for other high-power variable frequency applications. These include signal generation and spread-spectrum applications. These and other modifications to and variations upon the preferred embodiments are provided for by the present invention, the scope of which is limited only by the following claims.

What is claimed is:

1. A variable-frequency microwave frequency generator comprising:
    at least one negative-resistance diode device for oscillating over a given frequency range, said range having an oscillator bandwidth;
    a matching circuit coupled to said diode device so as to constitute an oscillator therewith, said matching circuit including plural resonators, each of said resonators having a respective half-power frequency range, every frequency within said given frequency range lying within the respective half-power range of at least one of said resonators, said matching circuit having a diode port at which it is coupled to said diode device, said matching circuit having a coupling port, said matching circuit providing impedance matching between said diode device and a predetermined coupling impedance at said coupling port;
    an injection source for supplying a variable-frequency injection signal; and
    a coupling circuit having an injection port coupled to said injection source, an oscillator port coupled to said coupling port of said matching circuit, and a transmission port, said coupling circuit directing said injection signal from said injection source to said matching circuit, said coupling circuit coupling said transmission port to said coupling port of said matching circuit, said coupling circuit having an impedance substantially equal to said coupling impedance.

2. A frequency generator as recited in claim 1 wherein said matching circuit and said coupling circuit are implemented as microstrip circuits and said diode device includes an IMPATT diode.

3. A frequency generator as recited in claim 1 wherein the number of diode devices is greater than one, wherein there is a respective matching circuit for each of said diode devices, and wherein said coupling circuit has a respective coupling port for each of the matching circuits.

4. A frequency generator as recited in claim 1 wherein each of said half-power frequency ranges has a respective resonator bandwidth less than said oscillator bandwidth.

5. A microwave oscillator comprising:
    a negative-resistance diode device for oscillating over a given frequency range, said range having an oscillator bandwidth; and
    a matching circuit coupled to said diode device so as to constitute an oscillator therewith, said matching circuit including plural resonators, each of said resonators having a respective half-power frequency range, every frequency within said given frequency range lying within the respective half-power range of at least one of said resonators, said matching circuit having a diode port at which it is coupled to said diode device, said matching circuit having a coupling port, said matching circuit providing impedance matching between said diode device and a predetermined coupling impedance at said coupling port.

6. An oscillator as recited in claim 5 wherein said matching circuit is implemented as a microstrip circuit and said diode device includes an IMPATT diode.

7. An oscillator as recited in claim 5 wherein each of said half-power frequency ranges has a respective resonator bandwidth less than said oscillator bandwidth.

* * * * *